(12) United States Patent
Rangan et al.

(10) Patent No.: US 9,504,156 B1
(45) Date of Patent: Nov. 22, 2016

(54) DISTRIBUTION OF RETURN PATHS FOR IMPROVED IMPEDANCE CONTROL AND REDUCED CROSSTALK

(75) Inventors: Gopinath Rangan, Fontainebleau (FR); Khai Nguyen, San Jose, CA (US); Chiakang Sung, Milpitas, CA (US)

(73) Assignee: Altera Corporation, San Jose, CA (US)

(*) Notice: Subject to any disclaimer, the term of this patent is extended or adjusted under 35 U.S.C. 154(b) by 693 days.

(21) Appl. No.: 11/784,540

(22) Filed: Apr. 6, 2007

Related U.S. Application Data (60) Provisional application No. 60/790,023, filed on Apr. 7, 2006.

(51) Int. Cl.
  *H05K 1/14*  (2006.01)
  *H05K 1/11*  (2006.01)
  *H05K 3/42*  (2006.01)

(52) U.S. Cl.
  CPC .......... *H05K 1/14* (2013.01); *H05K 1/114* (2013.01); *H05K 3/429* (2013.01)

(58) Field of Classification Search
  CPC ........ H05K 1/11; H05K 1/024; H05K 1/112; H05K 1/114; H05K 1/115; H05K 3/429; H01L 21/44; H01L 21/60; H01L 23/02; H01L 23/48; H01L 23/50; G06F 17/50
  USPC ........ 361/792, 777, 760, 780, 794; 174/250, 174/255, 260, 262; 438/128, 637, 666; 257/678, 700, 737, 738, 786; 716/12, 716/13
  See application file for complete search history.

(56) References Cited

U.S. PATENT DOCUMENTS

| | | | | |
|---|---|---|---|---|
| 5,847,936 A * | 12/1998 | Forehand et al. | ............ | 361/794 |
| 5,885,855 A * | 3/1999 | Liang | ............ | 438/128 |
| 6,198,635 B1 * | 3/2001 | Shenoy et al. | ............ | 361/760 |
| 6,323,559 B1 * | 11/2001 | Chan et al. | ............ | 257/778 |
| 6,388,890 B1 * | 5/2002 | Kwong et al. | ............ | 361/780 |
| 6,591,410 B1 * | 7/2003 | Ali et al. | ............ | 716/120 |
| 6,617,243 B1 * | 9/2003 | Weekly | ............ | 438/637 |
| 6,650,014 B2 * | 11/2003 | Kariyazaki | ............ | 257/737 |
| 6,734,046 B1 * | 5/2004 | Dahl | ............ | 438/129 |
| 6,762,366 B1 * | 7/2004 | Miller et al. | ............ | 174/250 |
| 7,062,744 B2 * | 6/2006 | Osann, Jr. | ............ | 716/16 |
| 7,102,377 B1 * | 9/2006 | Blanchet et al. | ............ | 324/765 |
| 7,453,143 B2 * | 11/2008 | Dutta | ............ | 257/700 |
| 7,472,367 B1 * | 12/2008 | Xie et al. | ............ | 716/132 |
| 7,501,341 B1 * | 3/2009 | Von Herzen | ............ | 438/666 |
| 2003/0170977 A1 * | 9/2003 | Weekly | ............ | 438/637 |
| 2005/0017357 A1 * | 1/2005 | Iida et al. | ............ | 257/738 |
| 2005/0050505 A1 * | 3/2005 | Bednar et al. | ............ | 716/12 |
| 2006/0118929 A1 * | 6/2006 | Ramakrishnan et al. | ..... | 257/678 |
| 2006/0249842 A1 * | 11/2006 | Isa et al. | ............ | 257/734 |

* cited by examiner

Primary Examiner — Xiaoliang Chen (57) ABSTRACT

To achieve an even distribution of different types of connections, sets of connection cells have been devised having different ratios of signal, power and ground connections in which the signal connections are all within a maximum distance of a power and/or a ground connection. In addition, the shapes of the cells are such that the cells fit together in a repeatable array that fully covers the plane of the interface, i.e., an array that tiles the plane. Accordingly, to distribute the connections substantially uniformly across the interface, the ratio of the number of signal connections, power connections and ground connections is determined; a cell is selected from the set of cells that has approximately the same ratio of the number of signal connections, power connections and ground connections; and the selected cell is repeatedly used to allocate the signal, power and ground connections in accordance with the distribution of connections in the selected cell until all the connections are distributed.

6 Claims, 9 Drawing Sheets

DISTRIBUTION OF RETURN PATHS FOR IMPROVED IMPEDANCE CONTROL AND REDUCED CROSSTALK

CLAIM OF PRIORITY

This application claims the benefit of the Apr. 7, 2006, filing date of our provisional application No. 60/790,023, which is incorporated herein by reference.

BACKGROUND OF THE INVENTION

Figure 1:
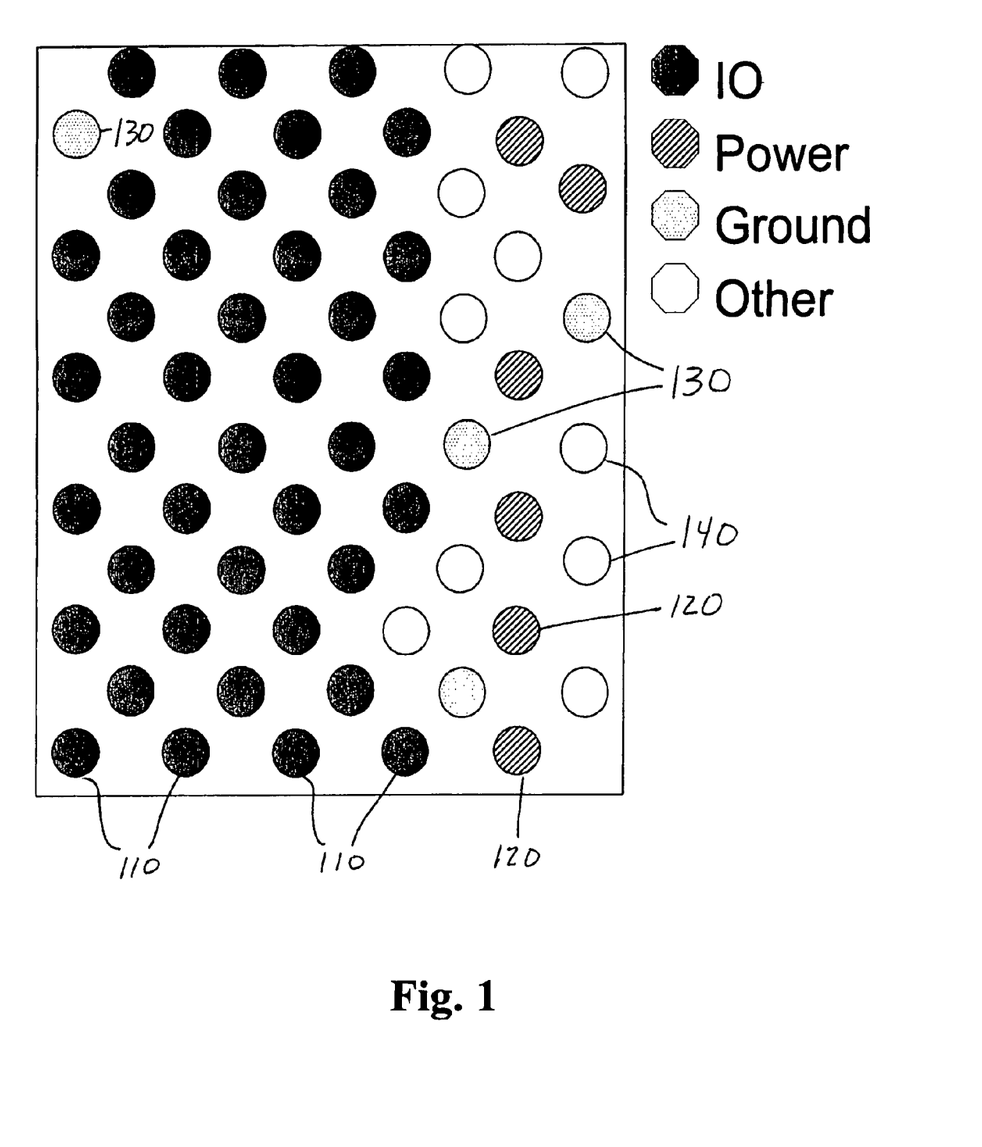
FIG. 1 depicts a typical distribution of connections contacts at the interface between a die and a substrate or between a substrate and a higher level substrate or board in the prior art.

FIG. 1 depicts a typical rectilinear connection pattern at an electrical interface. Illustratively, the interface is the interface between an integrated circuit and the substrate on which it is mounted which is known as the controlled, chip collapse connection (C4) and the individual connectors are solder balls or solder bumps and the pads on which they are mounted. Alternatively, the interface could be between a substrate and a higher level substrate or printed circuit board. Typically, the connections between the die and the substrate include connections for input/output (I/O) signals 110, for power 120, for ground 130, and for other purposes 140. As shown in FIG. 1, typical connection patterns tend to segregate each type of connection from the other types so that substantially all of the signal connections are in one portion of the interface, all of the power connections in another portion and all of the ground connections in a third portion.

Every signal junction presents a discontinuity to the signals sent across the medium. If not properly designed, large return loops can be created, causing large impedance discontinuities in the form of both mutual and self inductance.

As is known in the art, the input/output signals have return currents that pass through the power and ground connections. In high speed digital designs, the return current chooses the path of least impedance that minimizes the loop area between the outgoing and returning current paths because this is the path of least inductance. The return path which minimizes the loop area is typically directly underneath the signal path. In an ideal condition, both the signal trace and the return path are continuous without any impedance discrepancies. Interface design is critical in controlling this impedance.

SUMMARY OF THE PRESENT INVENTION

Just as in any connector, the way to minimize signal integrity issues through the connector is to provide sufficient return path for all signals. Since all signals are referenced to ground in the conventional integrated circuit package, sufficient ground connections are provided as return paths in the connection array. In addition, since the number of connections itself does not guarantee good return paths, these ground connections are placed near the input/output signal connections to function effectively as a return path. To achieve this for all I/O connections, in accordance with invention, the ground connections are evenly distributed throughout the array.

To achieve an even distribution of different types of connections, sets of connection cells have been devised having different ratios of signal, power and ground connections in which the signal connections are all within a maximum distance of a power and/or a ground connection. In addition, the shapes of the cells are such that the cells fit together in a repeatable array that fully covers the plane of the interface, i.e., an array that tiles the plane. Accordingly, to distribute the connections substantially uniformly across the interface, the ratio of the number of signal connections, power connections and ground connections is determined; a cell is selected from the set of cells that has approximately the same ratio of the number of signal connections, power connections and ground connections; and the selected cell is repeatedly used to allocate the signal, power and ground connections in accordance with the distribution of connections in the selected cell until all the connections are distributed.

By using this method to distribute signal, power and ground connections between die and package, a strong ground reference network can be formed. The innovative pattern helps reduce ground bounce and provide control over impedance. It also arrests propagation of noise at the source. As a result, signal integrity is sufficiently robust to support high speed operations in the GHz region.

BRIEF DESCRIPTION OF THE DRAWINGS

These and other objects, features and advantages of the present invention will be more readily apparent from the following Detailed Description in which.

DETAILED DESCRIPTION

Figure 2:
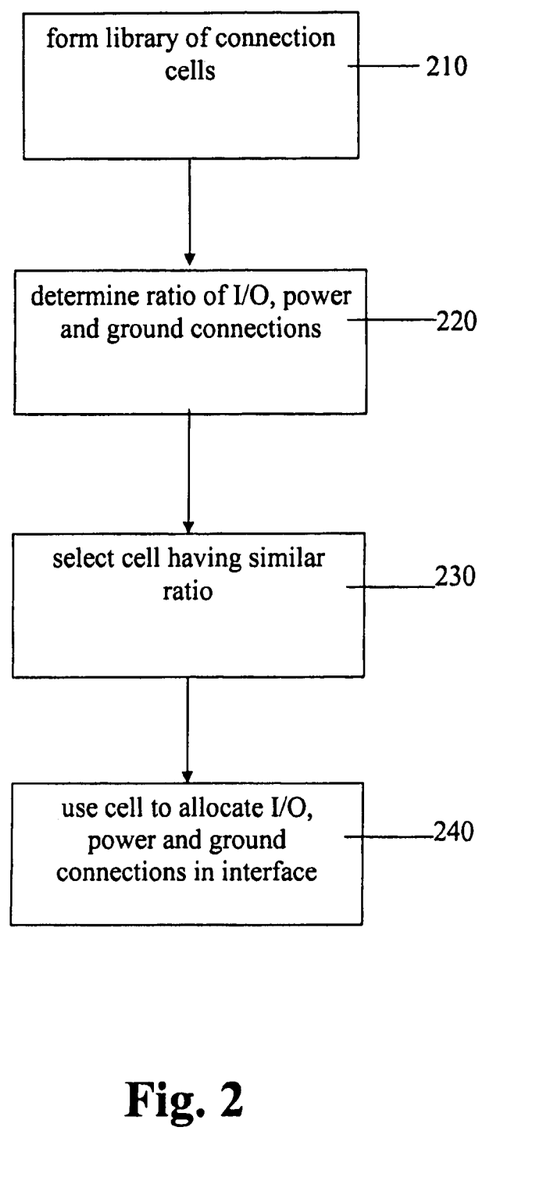
FIG. 2 is a flowchart depicting a first embodiment of the invention.

The interface between an integrated circuit die and substrate or between a substrate and higher level substrate or printed circuit board comprises input/output (I/O) signal, power and ground connections. Typically, these connections are made by solder balls or solder bumps and pads. In laying out these connections, the primary goal is to provide a close return path for every I/O signal. The secondary goal is to provide a uniform network to control impedance. These objectives can be achieved by following a set of rules in constructing the array of I/O signal, power and ground bumps. In particular, as shown in the flowchart of FIG. 2, at step 210 sets of connection cells are devised having different ratios of signal, power and ground connections in which the signal connections are all within a maximum distance of a power and/or a ground connection. In addition, the shapes of the cell must be such that the cells fit together in a repeatable array that fully covers the plane of the interface, i.e., an array that tiles the plane. At step 220, the ratio of the number of signal connections, power connections and ground connections is determined for a particular interface design. At step 230, a cell is selected from the set of cells that has approximately the same ratio of the number of signal connections, power connections and ground connections as the ratio determined in step 220. And at step 240, the selected cell is repeatedly used to allocate the signal, power and ground connections until all the connections are distributed in the interface. As a result, the signal, power and ground connections are distributed substantially uniformly in a high-density compact array.

Figure 3:
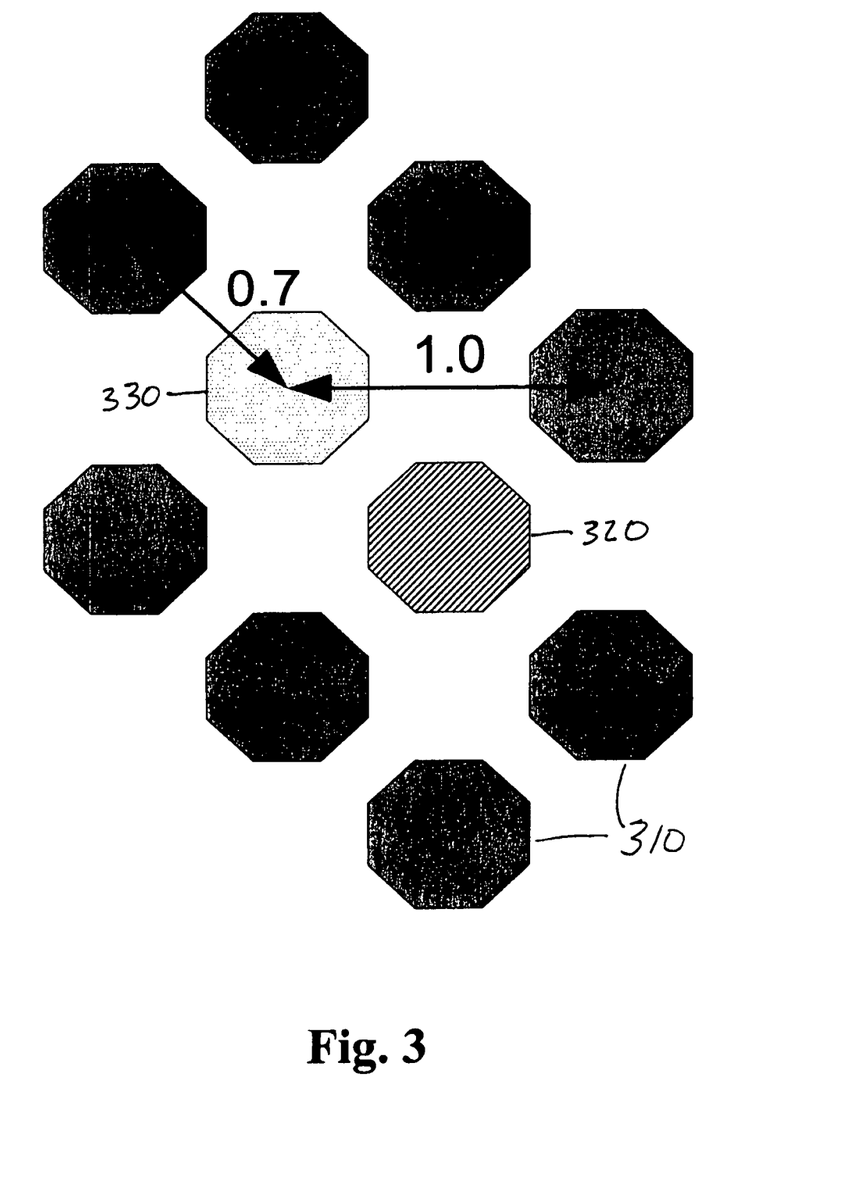
FIG. 3 depicts a distribution of connections in a first connection cell of the invention.
Figure 5:
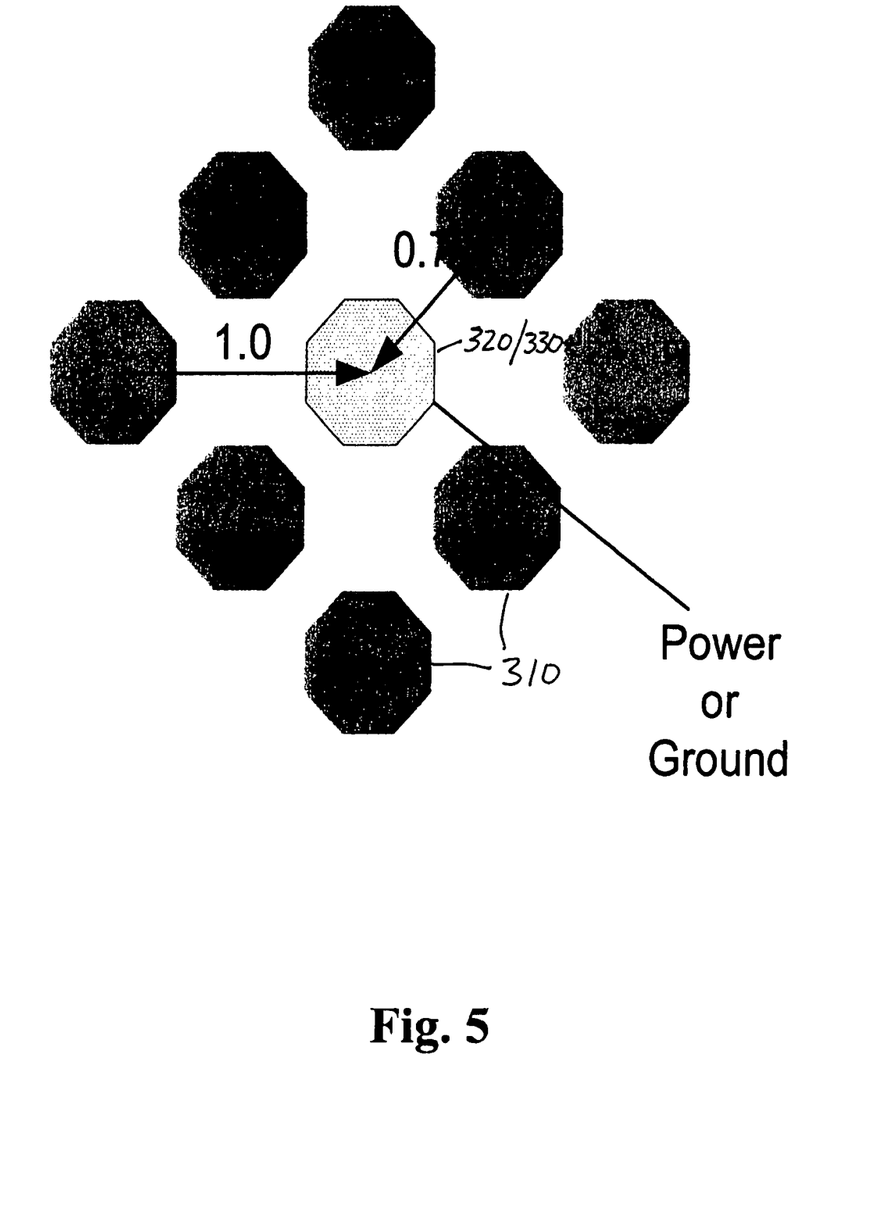
FIG. 5 depicts a distribution of connections in a third connection cell of the invention.
Figure 6:
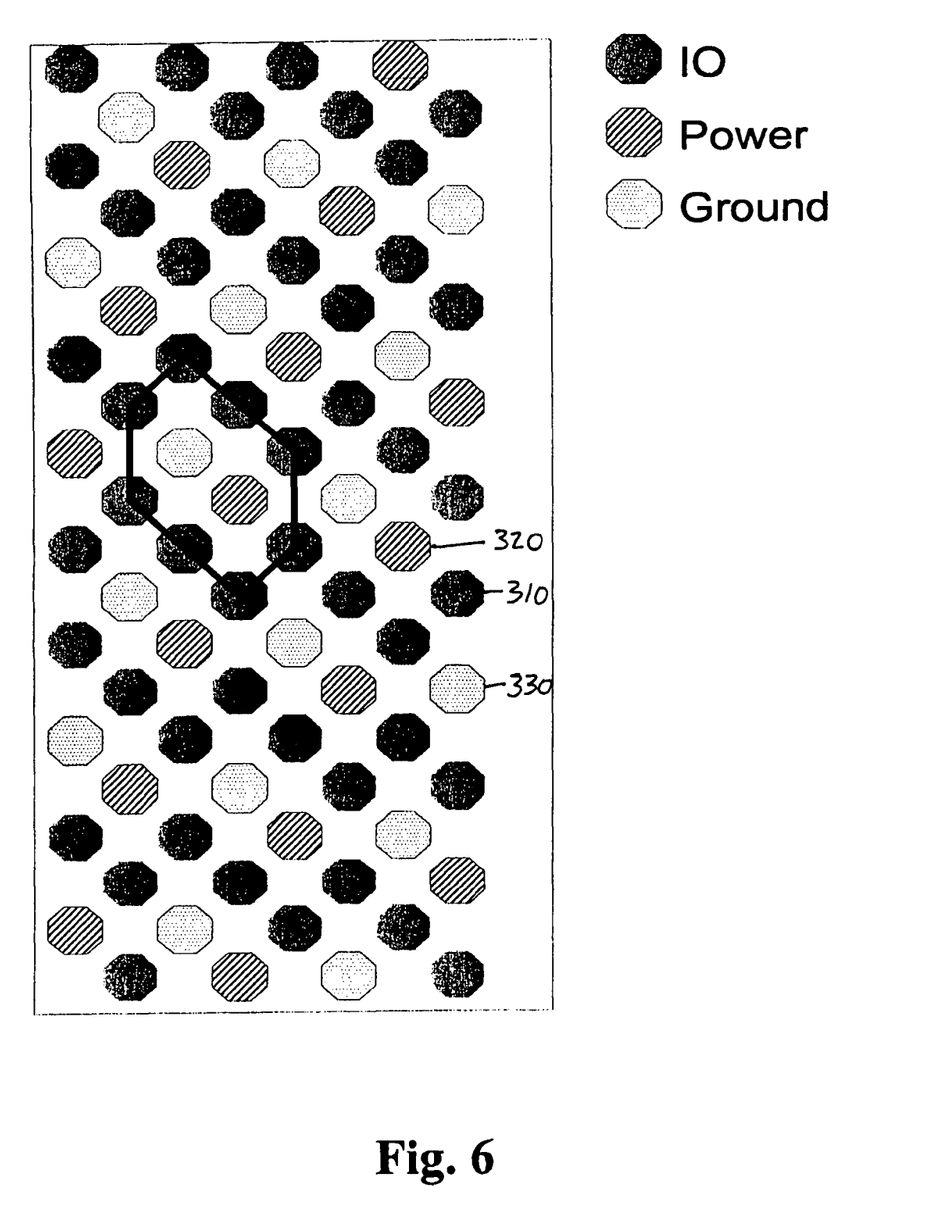
FIG. 6 depicts a first array of connections distributed in accordance with the invention.

An ideal power distribution network has signal reference to both ground and power. In this case, the pattern of connections preferably has a maximum pitch of no more than 1 unit between any I/O signal connection and its closest reference connection. Several illustrative connection cells are shown in FIGS. 3, 4, 5 and 9. FIG. 3 depicts a first connection cell comprising eight I/O signal connections 310, one power connection 320 and one ground connection 330. As in the case of the array of the connections shown in FIG. 1, the connections are arranged in a rectilinear array such that each connection has four nearest neighbor connections and four more connections slightly farther away. The center-to-center distance between a connection and each one of its farther neighbors is deemed to be a unit distance away. Accordingly, the center-to-center distance of a connection and each one of its four nearest neighbors is approximately 0.7 unit distance. FIG. 3 shows that a total of ten connections can be distributed in a rectilinear array with eight I/O connections within one unit distance of a power or a ground connection. Thus, the ratio of I/O signal connection to power connection to ground connection in the cell of FIG. 3 is 8:1:1. FIG. 6 demonstrates that the cell of FIG. 3 is repeatable over the plane of the interface.

The interconnection pattern of FIG. 3 can be represented typographically as:

```
    O   O   O

O   P   G   O

O   O   O
```

And the replication of this pattern as shown in FIG. 6 can be represented typographically as:

```
    O   O   O
O   P   G   O   O   O
        O   O   O   P   G   O
    O   P   G   O   O   O
            O   O   O   P   G   O
        O   P   G   O   O   O
``` where each O represents a signal connection, each P a power connection and each G a ground connection. As in FIGS. 3 and 6, the distance between two adjacent connections on a diagonal is a unit distance and the distance between two adjacent connections on a vertical or horizontal is approximately 0.7 unit distance. As will be apparent, the I/O supply connections in the basic pattern are shared by adjacent patterns. As a result, the ratio of the I/O supply connections to power to ground connections approaches 3:1:1 over the entire array of connections.

Figure 4:
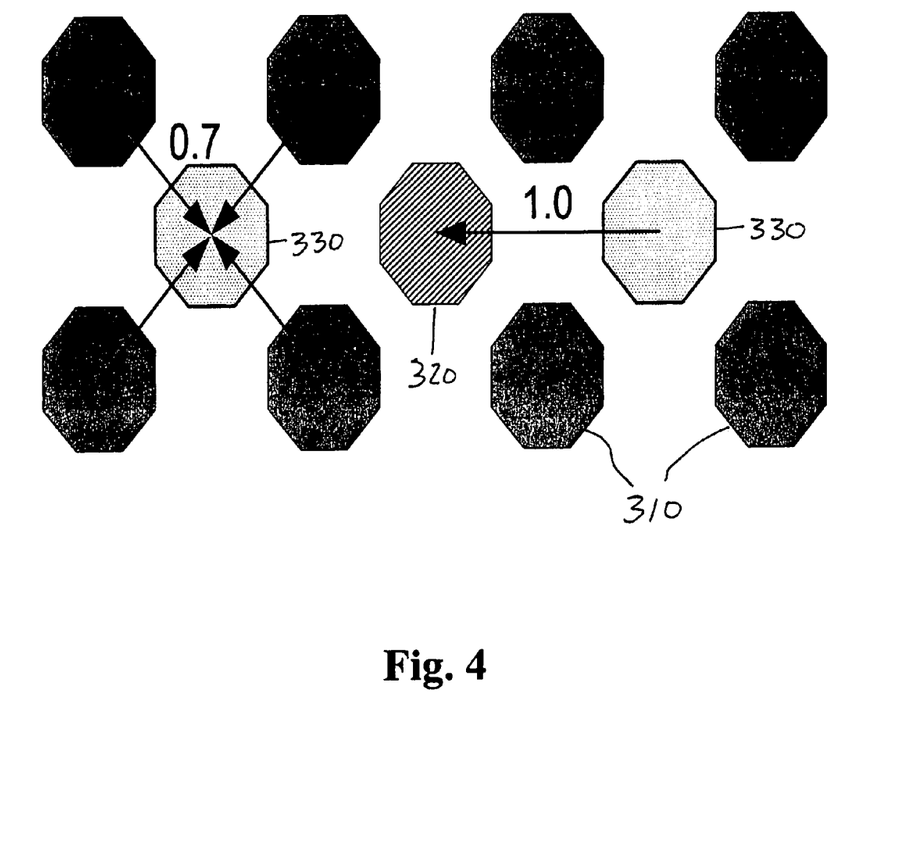
FIG. 4 depicts a distribution of connections in a second connection cell of the invention.
Figure 7:
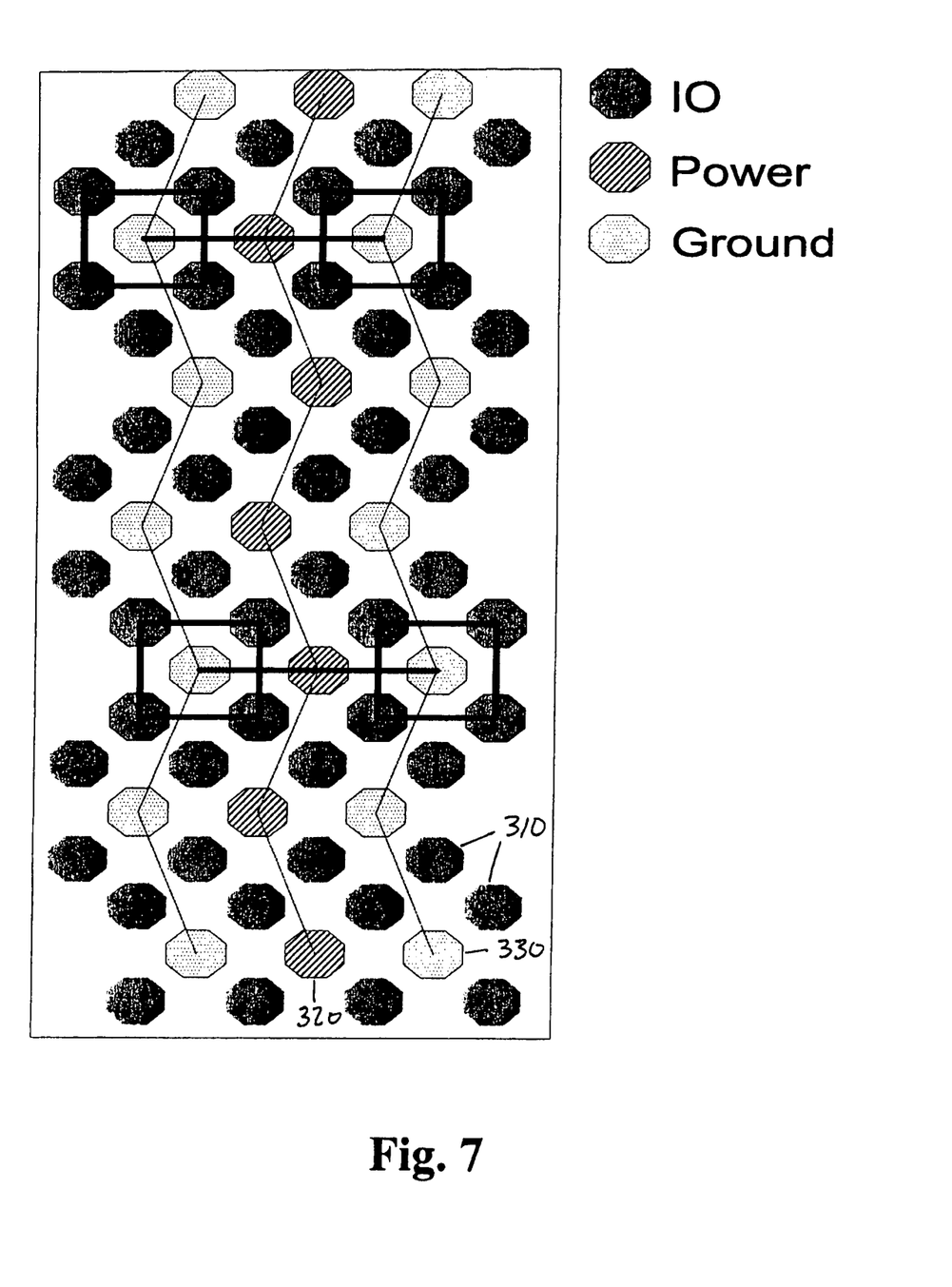
FIG. 7 depicts a second array of connections distributed in accordance with the invention.

FIG. 4 shows the placement of ground connections 330 among I/O connections 310 to achieve a pitch of less than one unit distance from any I/O connection to the closest ground connection. The pattern assumes a power to ground connection ratio of 2:1. A total of eight I/O connections can be placed in a compact repeatable pattern in this distribution. Thus, this cell has a ratio of I/O signal to power to ground connection of 8:2:1. FIG. 7 demonstrates that the cell of FIG. 4 is repeatable over the plane of the interface.

The interconnection pattern of FIG. 4 can be represented typographically as:

```
O   O   O   O
  P   G   P
O   O   O   O
``` where each O represents a signal connection, each P a power connection and each G a ground connection.

The replication of the pattern of FIG. 4 as shown in FIG. 7 can be represented typographically as:

```
O   O   O   O
  P   G   P
O   O   O   O

O   O   O   O
  P   G   P
O   O   O   O
``` where each O represents a signal connection, each P a power connection and each G a ground connection.

Alternatively, the pattern of FIG. 4 can be extended and replicated in a pattern which shares the signal connections that may be represented typographically as:

```
O   O   O   O   O   O   O
  P   G   P   G   P   G
O   O   O   O   O   O   O
  G   P   G   P   G   P
O   O   O   O   O   O   O
``` where each O represents a signal connection, each P a power connection and each G a ground connection. Here, the ratio of I/O supply connections to power to ground connections approaches 2:1:1 over the entire array of connections; and the basic cell that is replicated can be represented as:

```
O   O
  P   G
``` where O represents a signal connection, P a power connection and G a ground connection.

Figure 8:
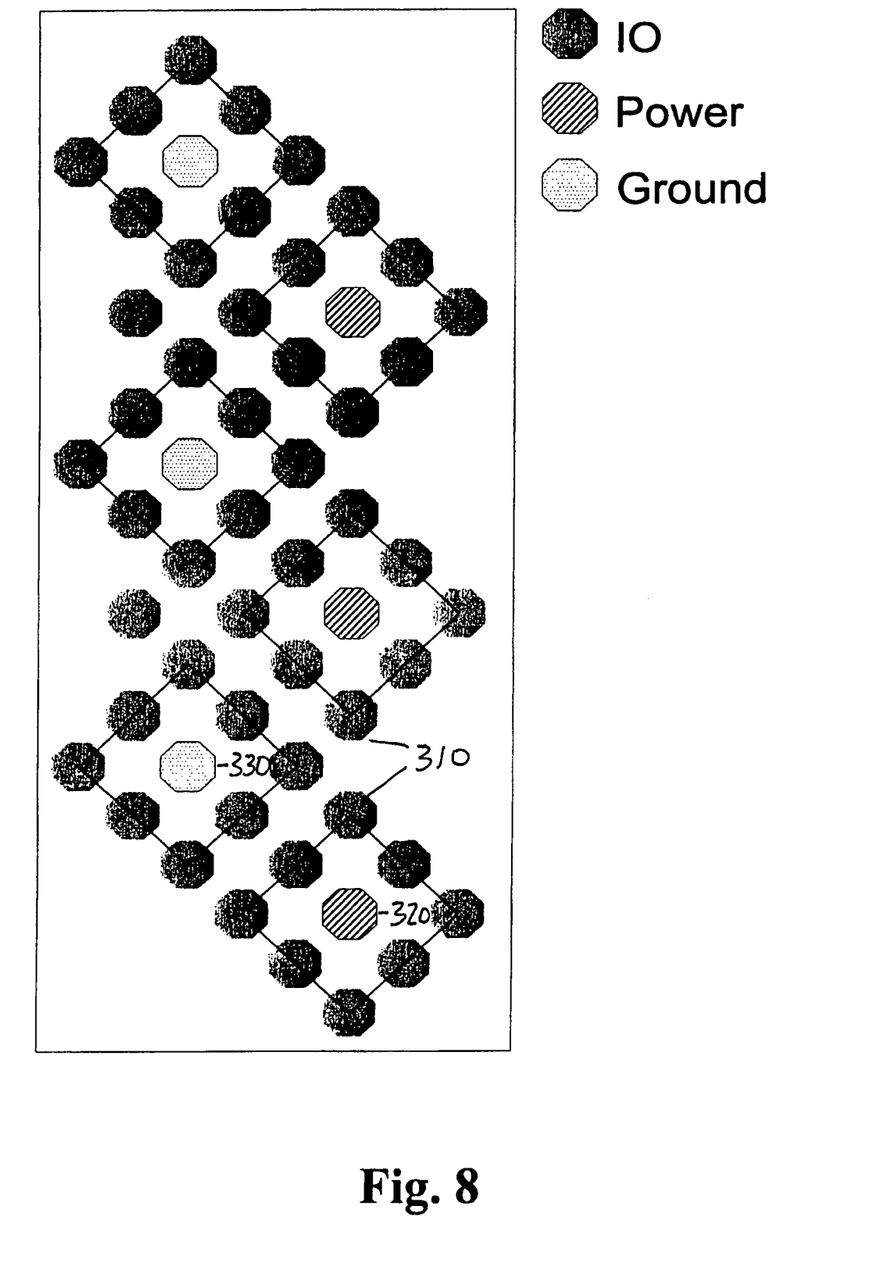
FIG. 8 depicts a third array of connections distributed in accordance with the invention.

The connection cells of FIGS. 3 and 4 place the power and ground connections adjacent one another to reduce loop inductance. In situations where power to ground coupling is not a consideration, the distribution can be relaxed to form a pattern with 16 I/O signal connections for every pair of power and ground connections. FIG. 5 depicts such a connection cell that is repeatable and has a maximum of one unit distance from the I/O signal connection 310 to the nearest power 320 or ground 330 connection. The replication of this cell in an array of cells in shown in FIG. 8. The ratio of I/O signal to power to ground connection in this cell is 16:1:1.

The interconnection pattern of FIG. 5 can be represented typographically as:

```
O  O  O  O  O  O
O  P  O  O  G  O
O  O  O  O  O  O
``` where each O represents a signal connection, each P represents a power connection and each G represents a ground connection.

This pattern may be replicated across the array of interconnections with or without sharing of the signal connections. Replication of this pattern with no sharing of signal connections is represented typographically as:

```
O  O  O  O  O  O
O  P  O  O  G  O
O  O  O  O  O  O
O  O  O  O  O  O
O  G  O  O  P  O
O  O  O  O  O  O
``` where each O represents a signal connection, each P represents a power connection and each G represents a ground connection.

If the rows of horizontal signal connection are shared between adjacent patterns, the basic cell of the pattern that is replicated may be represented typographically as:
where each O represents a signal connection, each P represents a power connection and each G represents a ground connection. The same pattern rotated by 90 degrees represents the sharing of columns of vertical supply connections shared between adjacent patterns. The ratio of the I/O signal connections to power connections to ground connections approaches 8:1:1 over the entire array of connections;

```
O  P  O  O  G  O
O  O  O  O  O  O
O  G  O  O  P  O
O  O  O  O  O  O
```

If both the rows of horizontal supply connections and the columns of horizontal supply connections are shared between adjacent patterns, the basic cell of the pattern that is replicated may be represented typographically as:

```
O  P  O  G
O  O  O  O
O  G  O  P
O  O  O  O
``` where each O represents a signal connection, each P represents a power connection and each G represents a ground connection. The ratio of the I/O signal connections to power connections to ground connections approaches 6:1:1 over the entire array of connections;

The distributed connection pattern provides a symmetric distribution of power and ground resulting in a uniform spread of reference paths to signals. The impedance seen by signals is evenly spread across the array of interconnects. The 8:2:1 distribution pattern shown in FIG. 4 is especially practical in providing ground reference when I/O signals in the package are routed using two layers.

Figure 9:
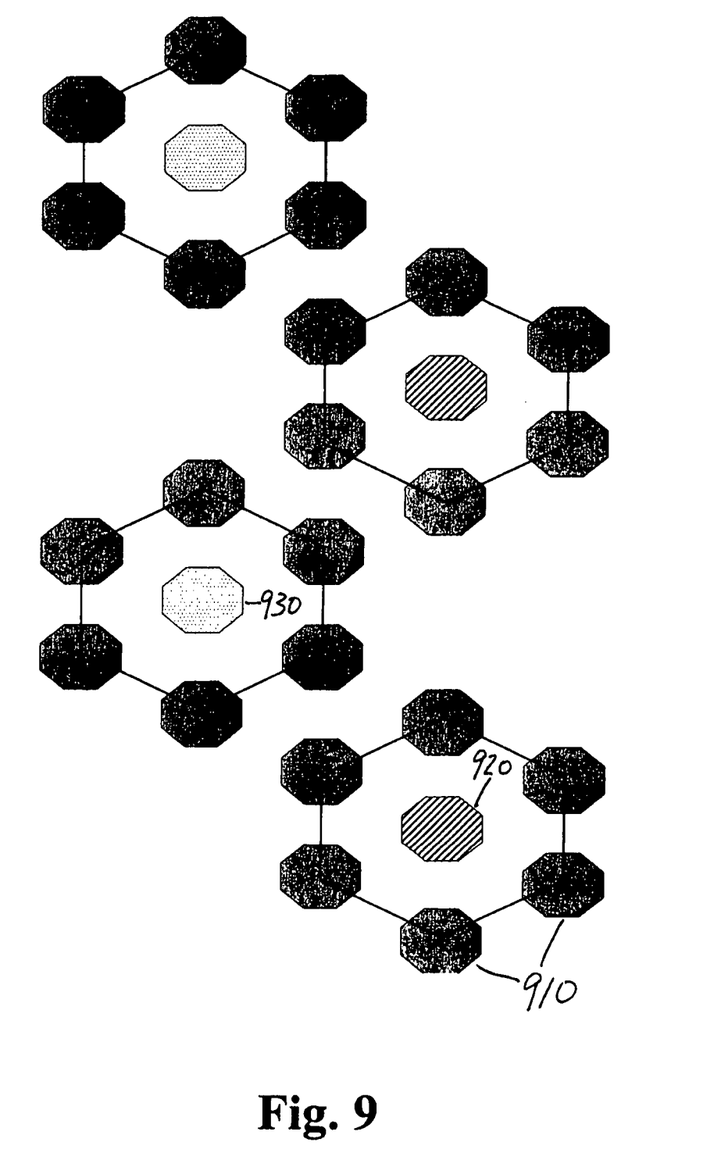
FIG. 9 depicts a fourth array of connections distributed in accordance with the invention.

While the connections shown in FIGS. 1 and 3, 5, 6 and 8 are arranged in a rectilinear array, the invention may also be practiced using a hexagonal array of connections such as shown in FIG. 9. In this case, each connection has six nearest neighbors located the same distance away. Thus, as shown in FIG. 9, six I/O signal connections 910 may surround a single power 920 or ground connection 930 with each of the six signal connections being located one unit distance away, thereby achieving an I/O signal to power/ground connection ratio of 6:1. This may be represented typographically as:

```
 O  O          O  O
O  P  O   or  O  G  O
 O  O          O  O
``` where each O represents a signal connection, each P represents a power connection and each G represents a ground connection.

A pair of two connections, one for power and one for ground, located next to each other may be surrounded by eight signal connections each located one unit distance away from one of the power and ground connections, thereby achieving an I/O signal to power to ground connection ratio of 8:1:1. This may be represented typographically as:

```
 O  O  O
O  P  G  O
 O  O  O
``` where each O represents a signal connection, each P represents a power connection and each G represents a ground connection.

And where the power and ground connections do not need to be closely coupled, six I/O signal connections can surround a power connection while six more I/O signal connections surround a ground connection as shown in FIG. 9. Such a cell has an I/O signal to power to ground connection ratio of 12:1:1.

Again, the basic pattern of FIG. 9 may be replicated with or without sharing of the signal connections. Replication without sharing may be represented typographically as:

```
O  O  O  O
   O  O  O  P  O
O  P  O  O  O
   O  O  O  O
O  O  O  G  O
   O  G  O  O  O
O  O  O  O
``` where each O represents a signal connection, each P represents a power connection and each G represents a ground connection. And replication with sharing of the supply connections may be represented typographically as:

```
      O  O  P  O
   O  P  O  O  G
P  O  O  G  O  O
   O  G  O  O  P
      O  O  P  O
         P  O  O
``` where each O represents a signal connection, each P represents a power connection and each G represents a ground connection. In this case, the ratio of the I/O supply connections to power or ground connection approaches 4:1:1 over the entire array of connections. The basic cell that is replicated can be represented typographically as:

```
      O
   O  G  O
      O  P
``` where O represents a signal connection, P a power connection and G a ground connection.

Where lower ratios of signal to power to ground connections are desired, a basic cell that is represented typographically as:

```
   O  P  G
``` can be replicated to produce an array that may be represented typographically as:

```
O  P  G  O  P  G
O  P  G  O  P  G
O  P  G  O  P  G
``` where O is a supply connection, P is a power connection and G is a ground connection. For this array, the supply connection to power to ground ratio is 1:1:1.

Numerous other arrangements of basic cells of signal, power and ground connections may also be devised by those skilled in the art. Further, it will be noted that the position of the power and ground connections can typically be interchanged in the various connection patterns described.

What is claimed is:

1. A method of distributing signal, power and ground connections at an electrical interface comprising the steps of:
   (a) determining from a total number of each of signal, power and ground connections to be provided at the electrical interface a ratio of the total number of each of signal, power and ground connections to be provided at the electrical interface where the number of signal connections is at least twice the sum of the number of power connections and the number of ground connections;
   (b) selecting from a set of repeatable cells of signal, power and ground connections in which each signal connection is no more than one unit distance from a nearest power or ground connection a cell having the ratio determined in step a;
   (c) locating the signal, power and ground connections in one portion of the interface in a pattern specified by the selected cell; and
   (d) repeating step c at least once in other portions of the interface with the same pattern specified by the cell selected in step b until the interface is filled with signal, power and ground connections where the number of signal connections is at least twice the sum of the number of power connections and the number of ground connections.

2. The method of claim 1 wherein the electrical interface is between an integrated circuit and a substrate or between a first substrate and a second substrate.

3. The method of claim 1 wherein the connections are solder balls or solder bumps.

4. A method of distributing signal, power and ground connections at an electrical interface comprising:
   (a) determining from a total number of each of signal, power and ground connections to be provided at the electrical interface a ratio of the total number of each of signal, power and ground connections to be provided at the electrical interface where the number of signal connections is at least twice the sum of the number of power connections and the number of ground connections;
   (b) selecting from a set of repeatable cells of signal, power and ground connections in which each signal connection is no more than one unit distance from a nearest power or ground connection a cell having the ratio determined in step (a) and a pattern of connections in which first and third rows of connections are signal connections and a second row between the first and third rows includes power, ground and signal connections that are located with power connections having a signal connection on each side of the power connection in the second row and ground connections having a signal connection on each side of the ground connection in the second row;
   (c) locating the signal, power and ground connections in one portion of the interface in the pattern specified by the selected cell; and
   (d) repeating step (c) at least once in other portions of the interface with the same pattern of connections specified by the cell selected in step (b) until the interface is filled with signal, power and ground connections where the number of signal connections is at least twice the sum of the number of power connections and the number of ground connections.

5. A method of distributing signal, power and ground connections at an electrical interface comprising:

(a) determining from a total number of each of signal, power and ground connections to be provided at the electrical interface a ratio of the total number of each of signal, power and ground connections to be provided at the electrical interface where the number of signal connections is at least twice the sum of the number of power connections and the number of ground connections;

(b) selecting from a set of repeatable cells of signal, power and ground connections in which each signal connection is no more than one unit distance from a nearest power or ground connection a cell having the ratio determined in step (a) and a pattern of connections in which first and third rows of connections are signal connections and a second row located between the first and third rows includes alternating power and ground connections;

(c) locating the signal, power and ground connections in one portion of the interface in the pattern specified by the selected cell; and (d) repeating step (c) at least once in other portions of the interface with the same pattern of connections specified by the cell selected in step (b) until the interface is filled with signal, power and ground connections where the number of signal connections is at least twice the sum of the number of power connections and the number of ground connections.

6. A method of distributing signal, power and ground connections at an electrical interface comprising the steps of:

(a) determining from a total number of each of signal, power and ground connections to be provided at the electrical interface a ratio of the total number of each of signal, power and ground connections to be provided at the electrical interface where the number of signal connections is at least twice the sum of the number of power connections and the number of ground connections;

(b) selecting from a set of repeatable cells of signal, power and ground connections in which each signal connection is no more than one unit distance from a nearest power or ground connection a cell having the ratio determined in step (a) and a pattern of connections arranged in rows and columns with a second row of connections located between first and third rows of connections wherein each of the first, second and third rows has power connections having a signal connection on each side of the power connection in the row and ground connections having a signal connection on each side of the ground connection in the row with the first, second and third rows being offset one from the other so that signal connections in the first and third rows are in the same column as a power or ground connection in the second row;

(c) locating the signal, power and ground connections in one portion of the interface in a pattern specified by the selected cell; and (d) repeating step (c) at least once in other portions of the interface with the same pattern of connections specified by the cell selected in step (b) until the interface is filled with signal, power and ground connections where the number of signal connections is at least twice the sum of the number of power connections and the number of ground connections.

\* \* \* \* \*